United States Patent
Zhu et al.

(10) Patent No.: US 11,709,622 B2
(45) Date of Patent: Jul. 25, 2023

(54) PERFORMING SCRAMBLING OPERATIONS BASED ON A PHYSICAL BLOCK ADDRESS OF A MEMORY SUB-SYSTEM

(71) Applicant: Micron Technology, Inc., Boise, ID (US)

(72) Inventors: Fangfang Zhu, San Jose, CA (US); Juane Li, Milpitas, CA (US); Seungjune Jeon, Santa Clara, CA (US); Jiangli Zhu, San Jose, CA (US); Ying Tai, Mountain View, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/489,405

(22) Filed: Sep. 29, 2021

(65) Prior Publication Data

US 2022/0100416 A1   Mar. 31, 2022

Related U.S. Application Data (60) Provisional application No. 63/085,812, filed on Sep. 30, 2020.

(51) Int. Cl.
*G06F 12/00* (2006.01)
*G06F 3/06* (2006.01)

(52) U.S. Cl.
CPC .......... *G06F 3/0655* (2013.01); *G06F 3/0604* (2013.01); *G06F 3/0679* (2013.01)

(58) Field of Classification Search
CPC .... G06F 3/0655; G06F 3/0604; G06F 3/0679; G06F 2212/1036; G06F 3/0616; G06F 3/064; G06F 12/1408; G06F 12/0246; G11C 7/1006
USPC ......................................................... 711/154
See application file for complete search history.

(56) References Cited

FOREIGN PATENT DOCUMENTS

| CN | 211454576 U | * | 9/2020 |
| CN | 113407155 A | * | 9/2021 |

* cited by examiner

*Primary Examiner* — Mardochee Chery
(74) *Attorney, Agent, or Firm* — Lowenstein Sandler LLP (57) ABSTRACT

Systems and methods are disclosed including a memory device and a processing device, operatively coupled with the memory device, to perform operations comprising: receiving a write data request to store write data to the memory device; determining a physical block address associated with the write data request; performing a bitwise operation on each bit of the physical block address to generate a seed value; generating an output sequence based on the seed value; performing another bitwise operation on the output sequence and the write data to generate a randomized sequence; and storing, on the memory device, the randomized sequence.

20 Claims, 5 Drawing Sheets

PERFORMING SCRAMBLING OPERATIONS BASED ON A PHYSICAL BLOCK ADDRESS OF A MEMORY SUB-SYSTEM

RELATED APPLICATION

This application claims the benefit of U.S. Provisional Application No. 63/085,812, filed Sep. 30, 2020, the entire content of which is hereby incorporated by reference.

TECHNICAL FIELD

Embodiments of the disclosure relate generally to memory sub-systems, and more specifically, relate to performing scrambling operations based on a physical block address of memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to performing scrambling operations based on a physical block address of memory sub-system. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Another example is a three-dimensional cross-point ("3D cross-point") memory device, which is a cross-point array of non-volatile memory cells Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values. The non-volatile memory devices can include three-dimensional cross-point ("3D cross-point") memory devices that are a cross-point array of non-volatile memory cells and can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

A memory device can be made up of bits arranged in a two-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

The storing or requesting of data by the host system can be based on random values (e.g., random numbers). For example, in a conventional memory sub-system, write data from a host system can be scrambled by utilizing a random value during a scrambling operation and storing the scrambled data on the memory components. The memory sub-system can utilize a pseudorandom number generator (PRNG) (e.g., a randomizer) to generate the random values. For example, the memory sub-system can provide an initial value (e.g., a seed value) to the PRNG and the PRNG can proceed to output a sequence based on the seed value. The PRNG, thus, changes the write data to scrambled data, which is stored by the memory sub-system in a pattern different from a pattern in which the unscrambled write data would have been stored. By scrambling the write data, the memory sub-system can distribute the write data more uniformly across the word lines and bit lines of a data block, which allows for a more even voltage distribution and reduced overuse of the same memory cells.

However, the PRNG is deterministic since the output of the PRNG is based on the seed value that is provided to the PRNG. In conventional systems, the PRNG selects a seed value based the last 8 bits of a physical block address (PBA), which only allows for a fixed number of combinations (e.g., 256). As long as PBAs have the same values on these bits, the PRNG generates the same data sequence for these PBAs. The PRNG is therefore susceptible to reusing specific data patterns since the amount of memory cells in a block far exceeds the amount of different combinations generated by a conventional PRNG. Repeatedly programming memory cells in the same data pattern (e.g., programming on the same bit line or on the same word line to the same data state), can cause issues such as program disturb and premature degradation of the memory cells.

Aspects of the present disclosure address the above and other deficiencies by providing a memory sub-system that performs scrambling operations based on an entire PBA of a memory sub-system. According to the aspects of the present disclosure, the memory sub-system can receive a write command to store write data at a PBA. In response, the memory sub-system can perform a bitwise operation (e.g., an exclusive OR (XOR) operation(s)) on each bit of the PBA to generate a seed value. The memory sub-system can then generate an output sequence based on the seed value and perform another bitwise operation on the output sequence and the write data to generate a randomized sequence. The randomized sequence can be stored on a memory device. By generating a seed value based on all of the bits of the PBA, the present disclosure distributes the different combinations more evenly on all PBAs of the block.

Advantages of the present disclosure include, but are not limited to increased randomness of scrambling operations performed by the memory sub-system. By increasing the randomness of scrambling operations, the present disclosure improves distribution of write data to memory cells, enabling the memory sub-system to distribute the write data more uniformly across the word lines and bit lines of a data block, which allows for a more even voltage distribution and reduced overuse of the same memory cells. Further, the present disclosure improves the health and increases the lifetime of the memory device by preventing same data patterns programmed to the memory device.

Figure 1:
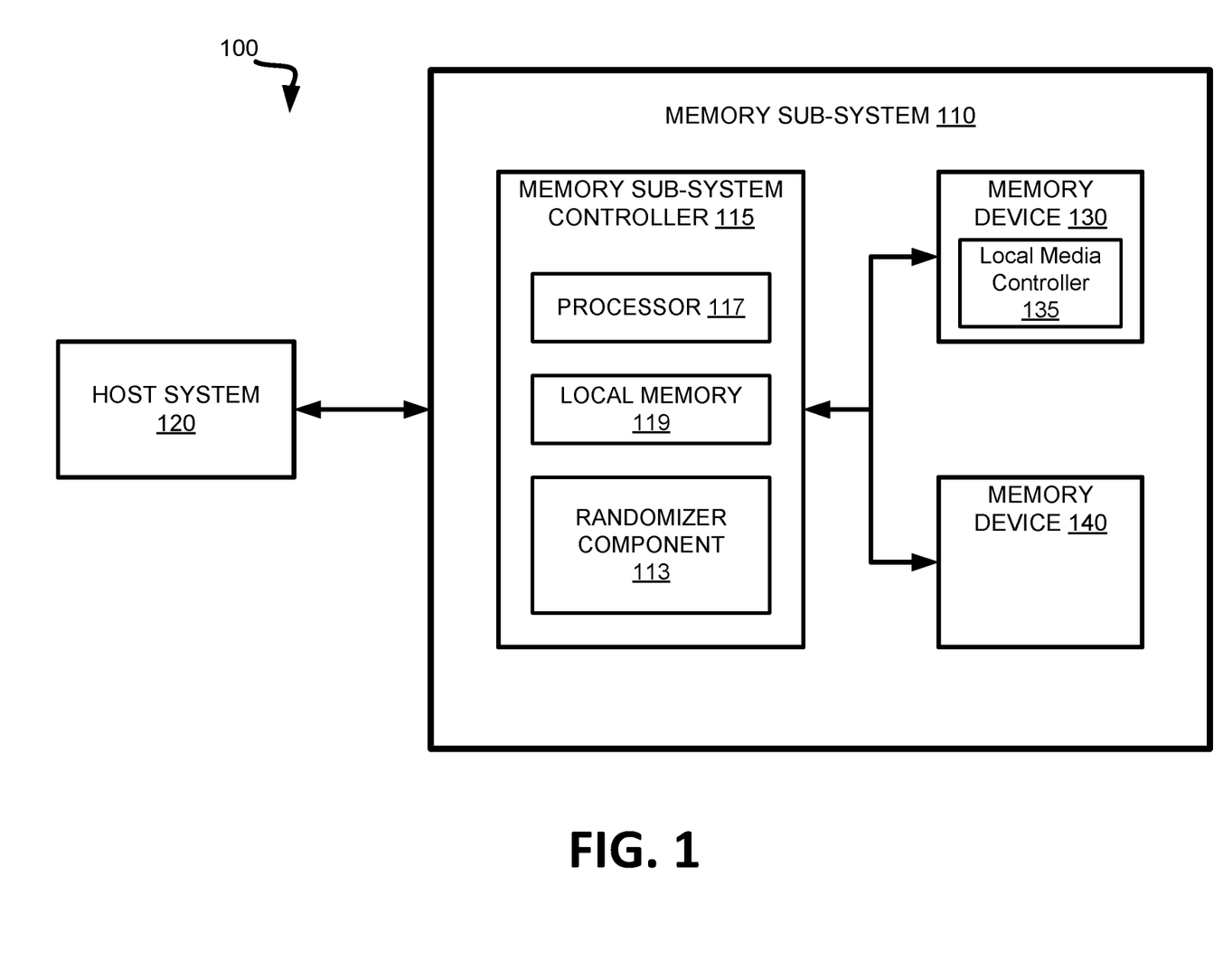
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address (PBA)) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

In some embodiments, the memory sub-system 110 includes a randomizer component 113 that can perform scrambling and descrambling operations based on an entire PBA. In some embodiments, the memory sub-system controller 115 includes at least a portion of the randomizer component 113. In some embodiments, the randomizer component 113 is part of the host system 110, an application, or an operating system. In other embodiments, local media controller 135 includes at least a portion of randomizer component 113 and is configured to perform the functionality described herein.

The randomizer component 113 can perform scrambling and descrambling operations based on an entire PBA. In some embodiments, the randomizer component 113 can receive a write command to store write data on memory device 130 and/or memory device 140. The write data can include, for example, a page, multiple pages, or any other unit of data. The write command can include a physical block address (PBA) to which to perform a write operation to store the write data. The PBA can be selected by the memory sub-system controller 115 or by the host system 120.

The randomizer component 113 can perform bitwise operations, concatenation operations, hash operations, or any other appropriate operation on each bit of the PBA to generate a seed value. A bitwise operation can include an AND operation, a NOT operation, an OR operation, an exclusive OR (XOR), bit shifting, or any other operation that operates on the individual bits of a bit string, a bit array, or a binary numeral.

In some embodiments, the randomizer component 113 can use the bitwise operations on each bit of the PBA to generate the seed value. By way of illustrative example, each PBA may include four bytes (each byte including eight bits), represented as by the following nomenclature: [31:24]; [23:16]; [15:8]; [7:0]. It is noted that, although the embodiments of this disclosure relate to a PBA of four bytes, the systems and methods discussed herewith can be used with a PBA of any size (e.g., three bytes, four bytes, five bytes, etc.). The randomizer component 113 can perform bitwise operations on the bits of the first byte (e.g., [7:0]), then perform bitwise operations on the bits of the second byte (e.g., [15:8]), then perform bit-wise operations on the bits of the third byte (e.g., [23:16]), and lastly perform bit-wise operations on the bits of the fourth byte (e.g., [31:24]) to generate the seed value. In one example, the randomizer component 113 can perform bitwise XOR operations on the bits of the first byte to generate a value, then perform bit-wise XOR operations on the bits of the second byte to generate another value, then perform bitwise XOR operations on the bits of the third byte to generate yet another value, and lastly perform bitwise XOR operations on the bits of the fourth byte to generate a final value. To generate each value, the bitwise operations can be similar or the same as each other, different from each other, or any combination thereof. The randomizer component 113 can then combine the values or perform additional bitwise operations on the values generate the seed value. Any combination of bitwise operations (or concatenation operations or hash operations), mathematical functions, or combining can be used to generate any combination of values to generate the seed value. The seed value can be any size, such as, for example, a 4-bit value, an 8-bit value, a 16-bit value, etc.

Using the seed value, the randomizer component 113 can then generate an output sequence. In some embodiments, the randomizer component 113 can feed the seed value into a random number generator (e.g., a pseudorandom number generator (PRNG) to generate the output sequence. The PRNG can use any method to generate the output sequence from the seed value, such as, for example, the Middle-Square Method, the Lehmer Generator, the Linear Congruential Generator (LCG), the Lagged Fibonacci Generator (LFG), etc.)

In some embodiments, the randomizer component 113 can use the output sequence of the values to changes the write data to scrambled data, which is stored on the memory device 130, 140 in a pattern different from a pattern in which the unscrambled write data would have been stored. In some embodiments, the randomizer component 113 can perform a bitwise operation(s) on the output sequence and the write data to generate a randomized sequence. For example, the randomizer component 113 can perform bitwise XOR operations on at least one value of the output sequence and at least a portion of the write data to scramble the write data (or each portion of write data). The randomized sequence can be stored on at least one of memory device 130 and/or memory device 140.

The randomizer component 113 can perform descrambling operations to descramble and retrieve the original data from the memory device 130 and/or memory device 140. For example, randomizer component 113 can use a descrambling function (e.g., a bitwise operation with a physical block address(es) of the data portion(s)) which, due to its symmetric nature, can descramble and retrieve the data. In some embodiments, the scrambled data can be stored in a data structure, such as, for example, a data scramble table. Accordingly, the randomizer component 113 can use the data structure to descramble and retrieve (or aid in descrambling and retrieving) the original data.

Figure 2:
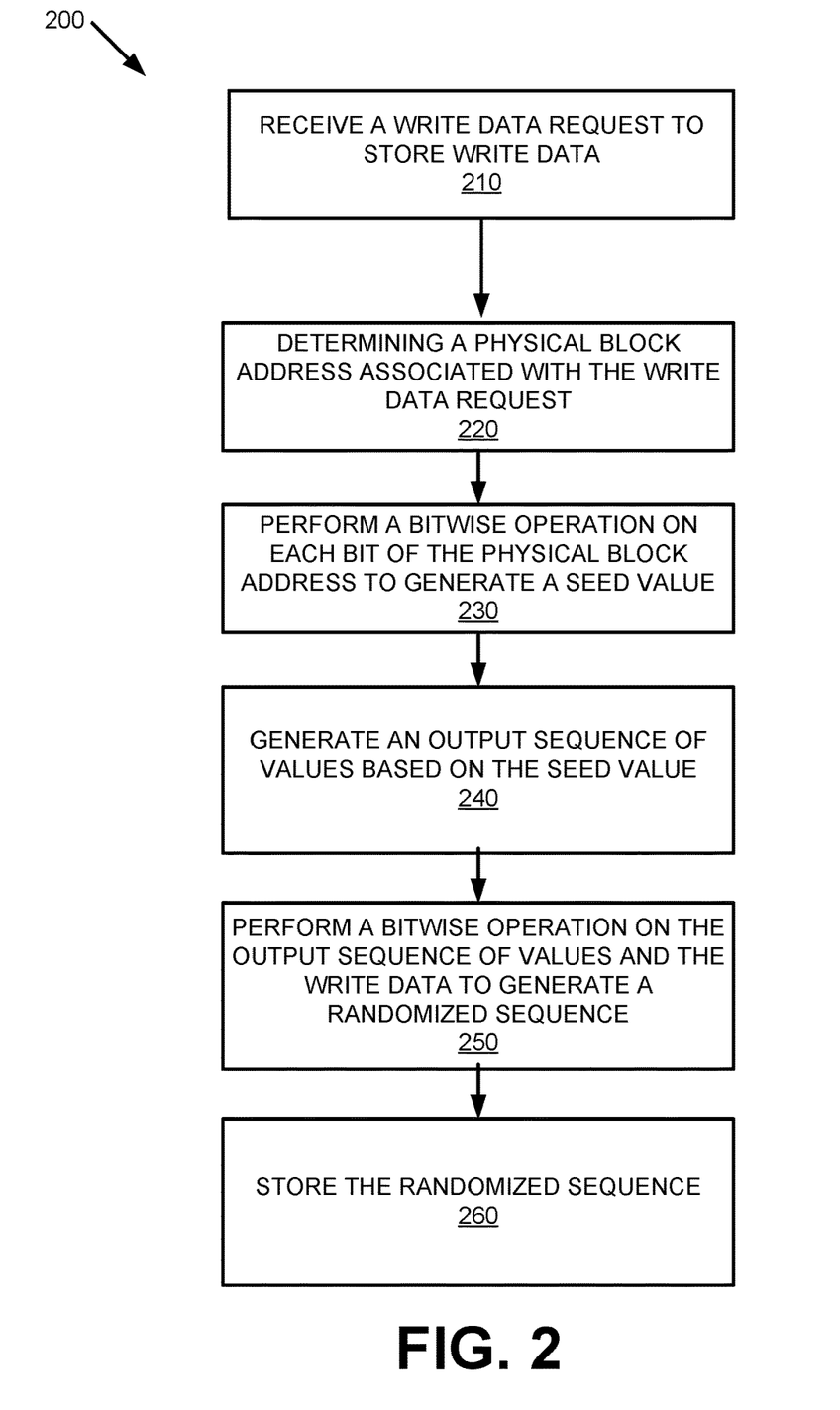
FIG. 2 is a flow diagram of an example method to perform scrambling operations based on an entire physical block address of memory sub-system, in accordance with some embodiments of the present disclosure.

FIG. 2 is a flow diagram of an example method 200 to perform scrambling operations based on an entire physical block address of memory sub-system, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the randomizer component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic can receive a write data request to store write data to at least one of the plurality of memory devices. The write data request can be received from the host system or from the memory sub-system controller.

At block 220, the processing logic determines a physical block address associated with the write data request. In some embodiments, the write data request references a logical block address. In such embodiments, the processing logic can translate the logical block address into a physical block address using, for example, a logical-to-physical (L2P) mapping table. In other embodiments, the write data request can reference a physical block address. In one embodiment, the physical block address can include four bytes.

At operation 230, the processing logic can perform a bitwise operation on each bit of the physical block address to generate a seed value. The bitwise operation can include AND operations, NAND operations, OR operations, XOR operations, bit shifting operations, etc. In some embodiments, the processing logic can perform concatenation operations, hash operations, or any other appropriate operation on each bit of the PBA to generate a seed value. In particular, the processing logic can perform bitwise operations on the bits of the first byte of the physical block address, then perform bitwise operations on the bits of the second byte of the physical block address, and so forth to generate the seed value. For example, where the physical block address includes four bytes, the processing logic can perform bitwise XOR operations on the bits of the first byte to generate a first value, then perform bit-wise XOR operations on the bits of the second byte to generate a second value, then perform bitwise XOR operations on the bits of the third byte to generate a third value, and lastly perform bitwise XOR operations on the bits of the fourth byte to generate a fourth value. The processing logic can then combine the four values or perform additional bitwise operations on the four values generate the seed value.

At operation 240, the processing logic can generate an output sequence based on the seed value. For example, the processing logic can feed the seed value into a PRNG to generate the output sequence.

At operation 250, the processing logic can perform another bitwise operation on the output sequence and the write data to generate a randomized sequence. The bitwise operation can include AND operations, NAND operations, OR operations, XOR operations, bit shifting operations, etc. In some embodiments, the processing logic can perform concatenation operations, hash operations, or any other appropriate operation on output sequence and the write data to generate the randomized sequence.

At operation 260, the processing logic can store, on at least one of the plurality of memory devices, the randomized sequence. The randomized sequence enables the processing logic to distribute the scrambled write data more uniformly across the word lines and bit lines of a data block, allowing for a more even voltage distribution and reduced overuse of the same memory cells.

Figure 3:
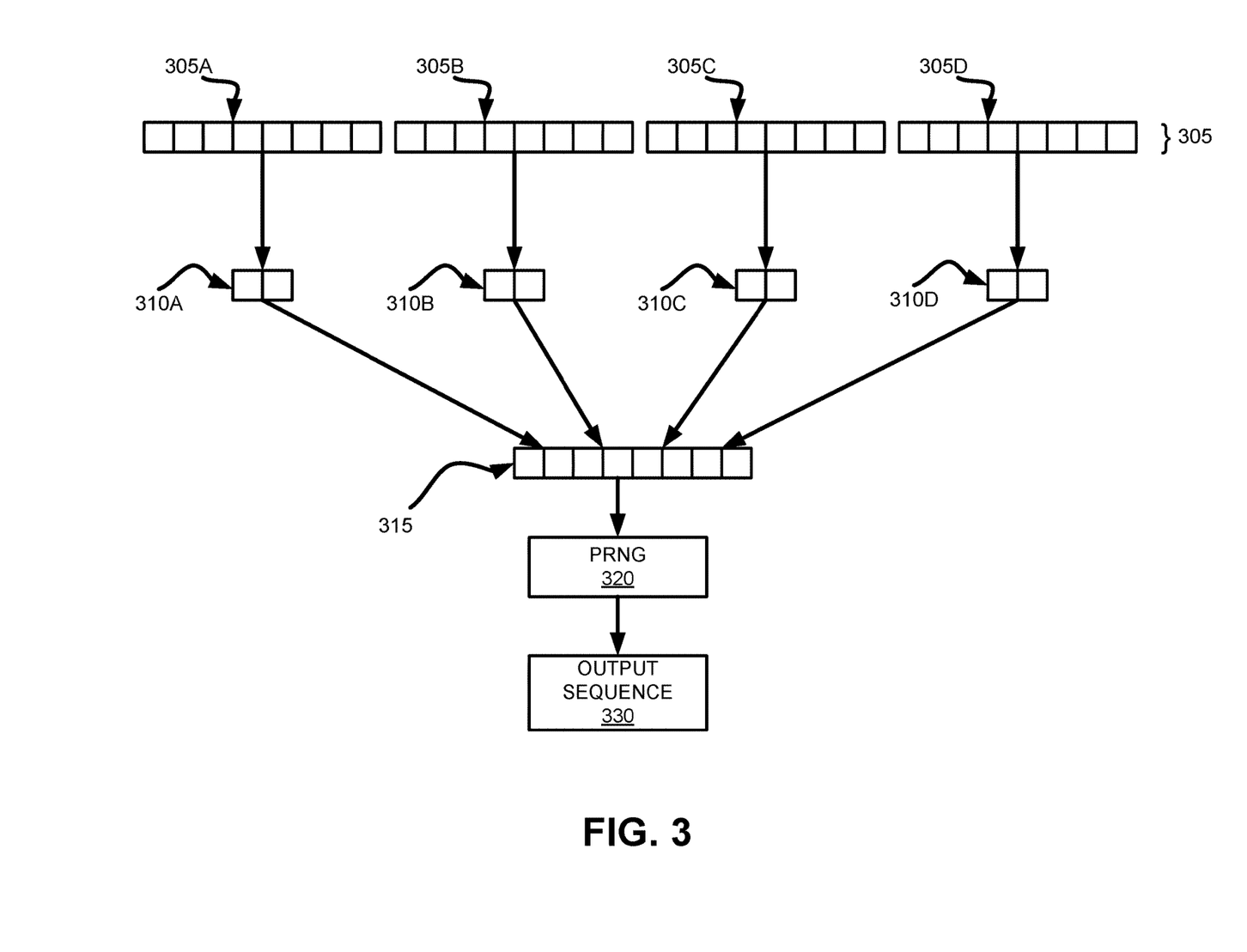
FIG. 3 schematically illustrates an example seed generating operation using bitwise XOR operations, in accordance with some embodiments of the present disclosure.

FIG. 3 schematically illustrates an example seed generating operation using bitwise XOR operations, in accordance with some embodiments of the present disclosure. Physical block address 305 includes four bytes 305A-305D (each byte including eight bits). The randomizer component 113 can perform bitwise XOR operations on each of the 8 bits of the first byte 305A to generate value 310A, then perform bit-wise XOR operations on the bits of the second byte 305B to generate value 310B, then perform bitwise XOR operations on the bits of the third byte 305C to generate value 310C, and lastly perform bitwise XOR operations on the bits of the fourth byte 305D to generate value 310D. The four values 310A-310D can be combined to generate an 8-bit seed value 315. In some embodiments, the four values 310A-310D can be combined sequentially, numerically, randomly, etc. In other embodiments, the four values can be combined using one or more bitwise operations on the four values generate the seed value 315. Seed value 315 can then be fed into PRNG 320 to generate an output sequence 330.

Figure 4:
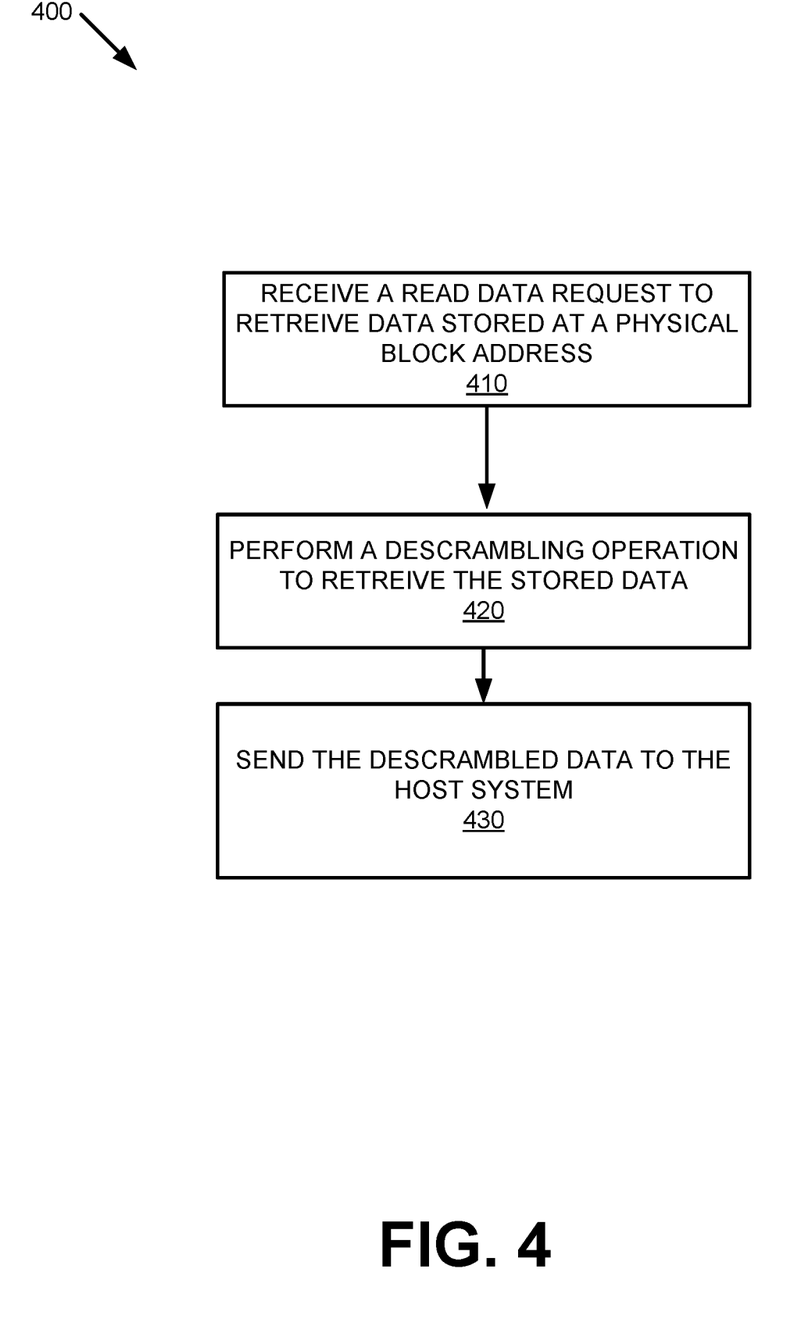
FIG. 4 is a flow diagram of an example method to perform descrambling operations, in accordance with some embodiments of the present disclosure.

FIG. 4 is a flow diagram of an example method 400 to perform descrambling operations, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the randomizer component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic receives, from the host system, a read data request to retrieve stored data from at least one of the plurality of memory devices. In some embodiments, the read data request reference a logical address block. In such embodiments, the processing logic can translate the logical address block into a physical block address using, for example, a page table. In other embodiments, the read data request can reference a physical block address. In some embodiments, the read data request can be received from the memory sub-system controller.

At operation 420, the processing logic performs descrambling operations to descramble and retrieve the original data from the memory device. For example, randomizer processing logic can use a descrambling function (e.g., a bitwise operation with a physical block address(es) of the data portion(s)) to descramble and retrieve the data. In some embodiments, the scrambled data can be stored in a data structure, such as, for example, a data scramble table. Accordingly, the processing logic can use the data structure to descramble and retrieve (or aid in descrambling and retrieving) the original data.

At operation 430, the processing logic sends the descrambled data to the host system.

Figure 5:
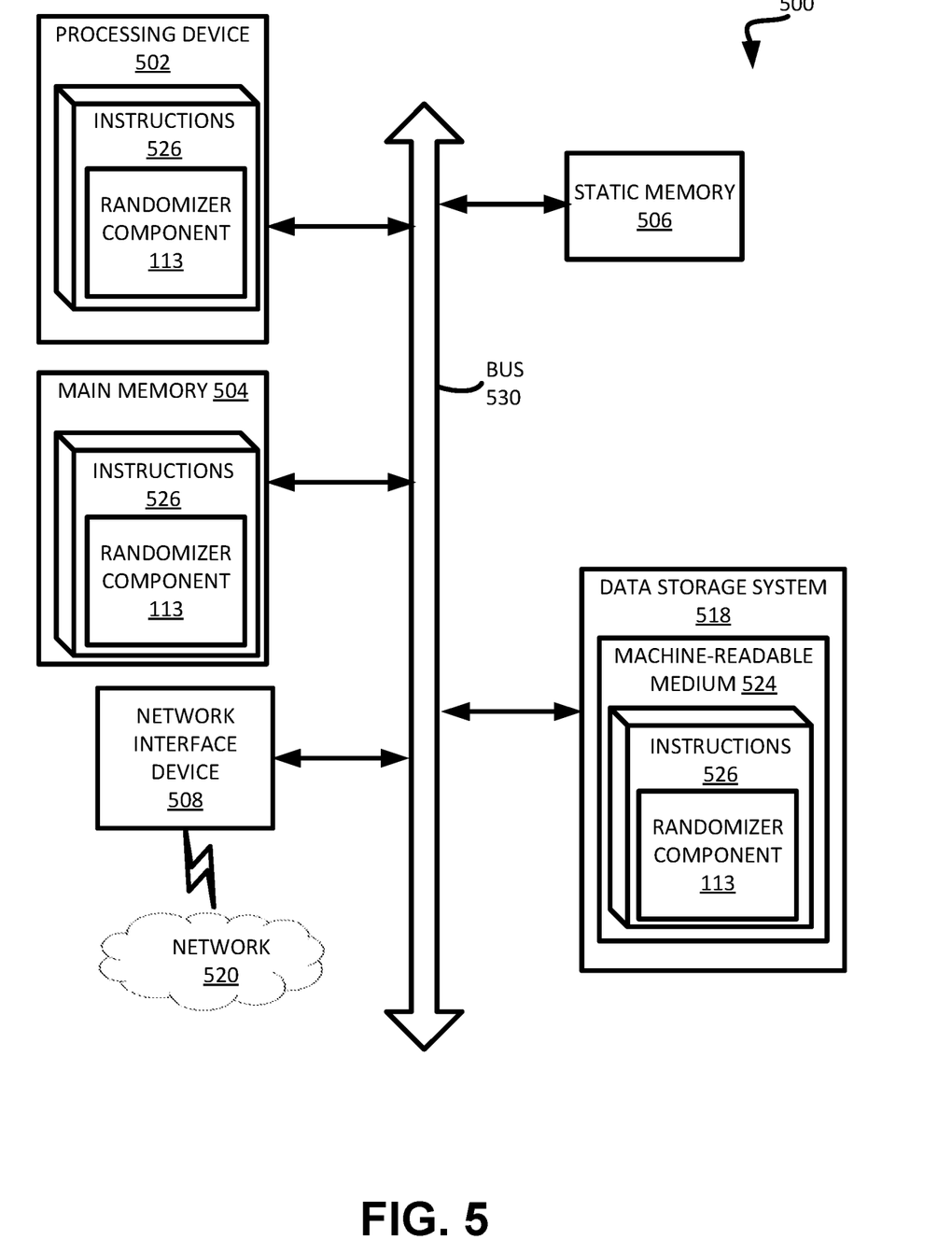
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the randomization component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a randomization component (e.g., the randomization component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
    a memory device; and
    a processing device, operatively coupled with the memory device, to perform operations comprising:
        receiving a write data request to store write data on the memory device;
        determining a physical block address associated with the write data request, wherein the physical block address comprises a set of bits;
        performing a bitwise operation on each bit of the set of bits of the physical block address to generate a set of values;
        generating a seed value based on the set of values;
        generating an output sequence based on the seed value;
        performing another bitwise operation on the output sequence and the write data to generate a randomized sequence; and
        storing, on the memory device, the randomized sequence.

2. The system of claim 1, wherein the bitwise operation comprises at least one of an exclusive-OR operation, an AND operation, a not-AND operation, or an OR operation.

3. The system of claim 1, wherein the processing device is to perform further operations comprising:
    retrieving the write data from the memory device using each bit of the physical block address and a further bitwise operation.

4. The system of claim 1, wherein the processing device is to perform further operations comprising:

performing a concatenation operation on each bit of the physical block address to generate the seed value; or performing a hash operation on each bit of the physical block address to generate the seed value.

5. The system of claim 1, wherein the processing device generates the output sequence using a pseudorandom number generator.

6. The system of claim 1, wherein the seed value comprises an 8-bit value.

7. The system of claim 1, wherein the physical block address comprises four bytes.

8. A method comprising:

receiving a write data request to store write data to a memory device;

determining a physical block address associated with the write data request, wherein the physical block address comprises a set of bits;

performing a bitwise operation on each bit of the set of bits of the physical block address to generate set of values;

generating a seed value based on the set of values;

generating an output sequence based on the seed value;

performing another bitwise operation on the output sequence and the write data to generate a randomized sequence; and storing, on the memory device, the randomized sequence.

9. The method of claim 8, wherein the bitwise operation comprises at least one of an exclusive-OR operation, an AND operation, a not-AND operation, or an OR operation.

10. The method of claim 8, further comprising:

retrieving the write data from the memory device using each bit of the physical block address and a further bitwise operation.

11. The method of claim 8, further comprising:

performing a concatenation operation on each bit of the physical block address to generate the seed value; or performing a hash operation on each bit of the physical block address to generate the seed value.

12. The method of claim 8, wherein the output sequence is generated using a pseudorandom number generator.

13. The method of claim 8, wherein the seed value comprises an 8-bit value.

14. The method of claim 8, wherein the physical block address comprises four bytes.

15. A non-transitory computer-readable storage medium comprising instructions that, when executed by a processing device operatively coupled to a memory device, performs operations comprising:

generating plurality of values each correlated to a byte of a plurality of bytes associated with a physical block address, wherein each value is generated by performing a bitwise operation on each bit of a byte of the plurality of bytes;

combining the plurality of values to generate a seed value;

generating an output sequence based on the seed value;

performing another bitwise operation on the output sequence and write data to generate a randomized sequence; and storing, on the memory device, the randomized sequence.

16. The non-transitory computer-readable storage medium of claim 15, wherein the bitwise operation comprises at least one of an exclusive-OR operation, an AND operation, a not-AND operation, or an OR operation.

17. The non-transitory computer-readable storage medium of claim 15, wherein the processing device is to perform further operations comprising:

retrieving stored data from the memory device using, at least, each bit of the physical block address and a further bitwise operation.

18. The non-transitory computer-readable storage medium of claim 15, wherein the processing device is to perform further operations comprising:

performing a concatenation operation on each bit of the physical block address to generate the seed value; or performing a hash operation on each bit of the physical block address to generate the seed value.

19. The non-transitory computer-readable storage medium of claim 15, wherein the processing device generates the output sequence using a pseudorandom number generator.

20. The non-transitory computer-readable storage medium of claim 15, wherein the seed value comprises an 8-bit value.

* * * * *